United States Patent
Fukuda (10) Patent No.: US 10,580,947 B2
(45) Date of Patent: Mar. 3, 2020

(54) PACKAGE AND PACKAGE INTERMEDIATE BODY

(71) Applicant: NICHIA CORPORATION, Anan-shi (JP)

(72) Inventor: Mayumi Fukuda, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/919,219

(22) Filed: Mar. 13, 2018

(65) Prior Publication Data
US 2018/0204990 A1    Jul. 19, 2018

Related U.S. Application Data

(62) Division of application No. 15/364,265, filed on Nov. 30, 2016, now Pat. No. 9,954,151.

(30) Foreign Application Priority Data

Nov. 30, 2015   (JP) ................................. 2015-233752

(51) Int. Cl.
*H01L 33/54*   (2010.01)
*H01L 33/48*   (2010.01)
(Continued)

(52) U.S. Cl.
CPC ............ *H01L 33/54* (2013.01); *H01L 33/486* (2013.01); *H01L 33/62* (2013.01); *H01L 33/56* (2013.01);
(Continued)

(58) Field of Classification Search
CPC .............................. H01L 33/54; H01L 33/486
(Continued)

(56) References Cited

U.S. PATENT DOCUMENTS 5,074,772 A    12/1991   Gutjahr
9,853,012 B2   12/2017   Chung et al.
(Continued)

FOREIGN PATENT DOCUMENTS

CN    202797084 U    3/2013
CN    203351644 U    12/2013
(Continued)

OTHER PUBLICATIONS

Notice of Allowance issued by the United States Patent and Trademark Office for the U.S. Appl. No. 15/364,265, dated Jan. 24, 2018.

*Primary Examiner* — Bo Fan
(74) *Attorney, Agent, or Firm* — Mori & Ward, LLP (57) ABSTRACT

A package has a first electrode, a second electrode, and a first resin body. The first resin body has a retainer portion and a wall portion. The retainer portion retains the first electrode and the second electrode and forms a bottom portion of the package together with the first electrode and the second electrode. The wall portion surrounds a mounting region on the bottom portion and has a pair of opposite outer sides. Each of the first electrode and the second electrode has an outer lead portion extending outwardly from respective one of the pair of opposite outer sides of the wall portion. The first resin body further has a flange portion having parts extending from the pair of opposite outer sides of the wall portion. Each of the outer lead portions extends outwardly beyond a distal end of the corresponding part of the flange portion in plan view.

15 Claims, 7 Drawing Sheets

(51) Int. Cl.
*H01L 33/62* (2010.01)
*H01L 33/56* (2010.01)

(52) U.S. Cl.
CPC .............. *H01L 2224/48091* (2013.01); *H01L 2224/48247* (2013.01); *H01L 2224/48257* (2013.01); *H01L 2933/005* (2013.01); *H01L 2933/0033* (2013.01); *H01L 2933/0066* (2013.01)

(58) Field of Classification Search
USPC ........................... 257/99, 786; 438/424, 459
See application file for complete search history.

(56) References Cited

U.S. PATENT DOCUMENTS

| | | | |
|---|---|---|---|
| 2004/0081416 A1 | 4/2004 | Akutsu et al. | |
| 2008/0012036 A1 | 1/2008 | Loh et al. | |
| 2008/0121921 A1* | 5/2008 | Loh | H01L 33/642 257/99 |
| 2012/0025260 A1 | 2/2012 | Oonakahara et al. | |
| 2012/0205712 A1* | 8/2012 | Hayashi | B29C 45/0046 257/100 |
| 2014/0021592 A1 | 1/2014 | Chi | |
| 2014/0054629 A1 | 2/2014 | Kim | |
| 2014/0203304 A1 | 7/2014 | Kim et al. | |
| 2015/0340568 A1* | 11/2015 | Hsieh | H01L 33/483 174/250 |
| 2016/0093785 A1 | 3/2016 | Fukuda | |

FOREIGN PATENT DOCUMENTS

| | | |
|---|---|---|
| CN | 103579470 | 2/2014 |
| CN | 203466217 U | 3/2014 |
| CN | 203967130 U | 11/2014 |
| CN | 203967131 U | 11/2014 |
| CN | 204130589 U | 1/2015 |
| CN | 204333031 U | 5/2015 |
| CN | 204558528 U | 8/2015 |
| EP | 2701193 | 2/2014 |
| JP | 03-207625 | 9/1991 |
| JP | 03-274127 | 12/1991 |
| JP | 2004-144987 | 5/2004 |
| JP | 2006-156704 | 6/2006 |
| JP | 2008-072092 | 3/2008 |
| JP | 2008-182242 | 8/2008 |
| JP | 2009-283883 | 12/2009 |
| JP | 2010-186896 | 8/2010 |
| JP | 5246662 B2 | 8/2010 |
| JP | 2011-103437 | 5/2011 |
| JP | 2011-233928 | 11/2011 |
| JP | 2012-028694 | 2/2012 |
| JP | 2012-039162 | 2/2012 |
| JP | 2012-231068 | 11/2012 |
| JP | 2012-234947 | 11/2012 |
| JP | 2013-051296 | 3/2013 |
| JP | 2013-077813 | 4/2013 |
| JP | 2013-161903 | 8/2013 |
| JP | 2013-183013 | 9/2013 |
| JP | 2014-022720 | 2/2014 |
| JP | 2015-005584 | 1/2015 |
| JP | 2015-015327 | 1/2015 |
| JP | 2015-015404 | 1/2015 |
| JP | 2015-015405 | 1/2015 |
| JP | 2015-015406 | 1/2015 |
| JP | 2015-018847 | 1/2015 |
| JP | 2015-226063 | 12/2015 |
| JP | 2016-072607 | 5/2016 |
| KR | 10-2012-0050283 | 5/2012 |

* cited by examiner

FIG. 12

PACKAGE AND PACKAGE INTERMEDIATE BODY

CROSS-REFERENCE TO RELATED APPLICATION

This is a divisional application of the U.S. patent application Ser. No. 15/364,265 filed on Nov. 30, 2016, which claims priority to Japanese Patent Application No. 2015-233752, filed on Nov. 30, 2015, the entire disclosure of which is hereby incorporated by reference.

BACKGROUND

1. Technical Field

The present disclosure relates to a package and a package intermediate body.

2. Description of Related Art

Conventionally, packages having leads have been manufactured by injection of a thermoplastic resin from lower sides of the packages (see Japanese Unexamined Patent Application Publication Nos. 2010-186896 and 2013-051296, for example). After the resin is cured, the leads are folded to form a light emitting device.

A known method for forming a package includes the steps of injecting a resin into a cavity of a mold corresponding to the shape of the package and curing the resin to form a resin body integrally with leads (see Japanese Unexamined Patent Application Publication No. 2013-077813, for example).

SUMMARY OF THE INVENTION

A package intermediate body according to an embodiment of the present disclosure includes: a lead frame having a frame, a first electrode, a second electrode, a first connecting portion connecting the frame and the first electrode, a second connecting portion connecting the frame and the second electrode, a first through-hole between the first electrode and the first connecting portion, and a second through-hole between the second electrode and the second connecting portion; and a first resin body having: a retainer portion retaining the first electrode and the second electrode, the retainer portion forming a bottom portion of the package intermediate body together with the first electrode and the second electrode, the bottom portion having a mounting region on which an electronic component is to be mounted; and a wall portion surrounding the mounting region and having a plurality of outer sides. In this package intermediate body, the retainer portion has a flange portion extending outwardly from and along the plurality of outer sides of the wall portion, and the first connecting portion and the second connecting portion are each located outside a distal end the flange portion in plan view.

A package according to an embodiment of the present disclosure includes: a first electrode, a second electrode, a first resin body having: a retainer portion retaining the first electrode and the second electrode, the retainer portion forming a bottom portion of the package together with the first electrode and the second electrode, the bottom portion having a mounting region on which an electronic component is to be mounted; and a wall portion surrounding the mounting region and having a plurality of outer sides. In this package, two of the plurality of outer sides of the wall portion constitute a pair of opposite outer sides; the first electrode has a first outer lead portion extending from one of the pair of opposite outer sides and the second electrode has a second outer lead portion extending from the other one of the pair of opposite outer sides; the first resin body further has a flange portion, the flange portion having a part extending outwardly from the outer side from which the first outer lead portion extends, and a part extending outwardly from the outer side from which the second outer lead portion extends; and each of the first outer lead portion and the second outer lead portion extends outwardly beyond a distal end of the corresponding part of the flange portion in plan view.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

The embodiments will now be described with reference to the accompanying drawings, wherein like reference numerals designate corresponding or identical elements throughout the various drawings.

Description will be given of a package, a light emitting device, and a manufacturing method thereof, which represent an exemplary embodiment. Drawings referenced in the following description schematically show embodiments. Thus, scales of members, distances between members, and positional relation between members or the like may have been presented in an exaggerated manner, and illustration of a part of a member may have been omitted. In the following description, members that are the same or analogous will be given the same name or number in principle, and duplicative detailed descriptions will be appropriately omitted.

Structure of Light Emitting Device 1

Figure 1:
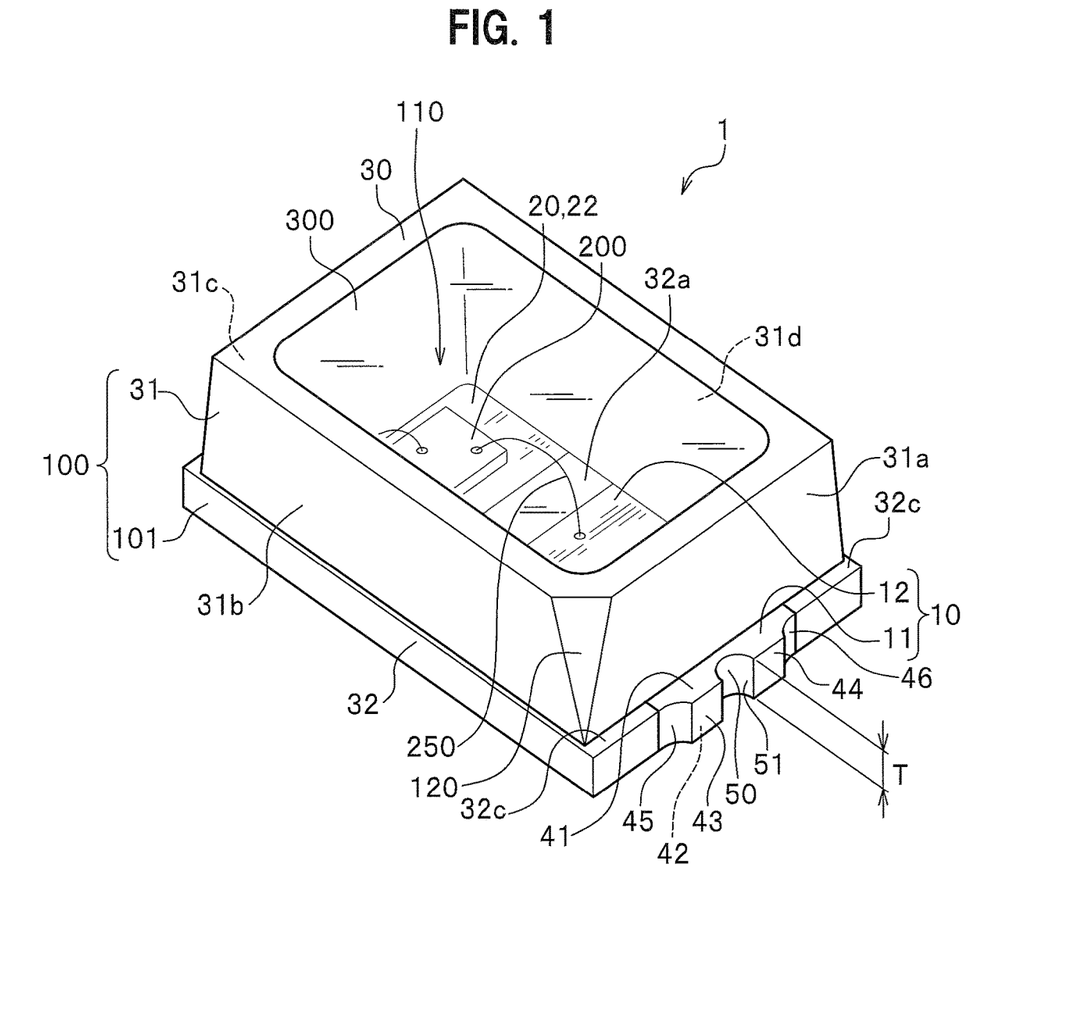
FIG. 1 is a schematic perspective view showing the whole of a light emitting device according to an embodiment of the present disclosure.
Figure 2:
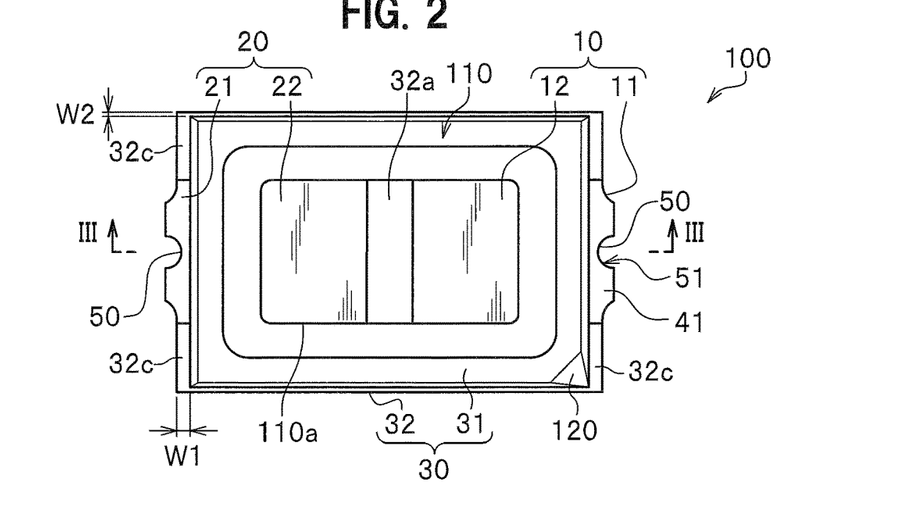
FIG. 2 is a schematic plan view of a package according to the embodiment.
Figure 3:
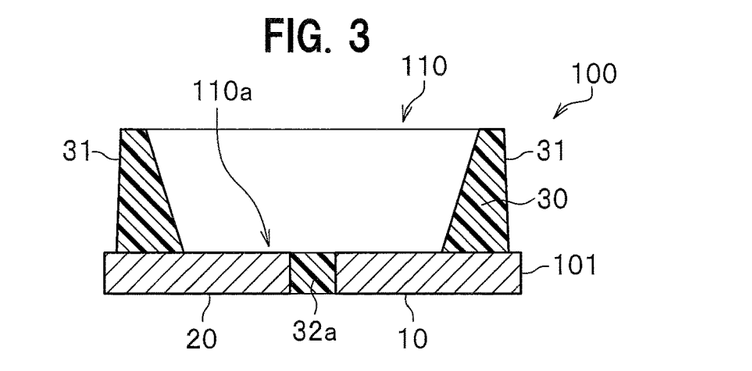
FIG. 3 is a schematic cross-sectional view of the package according to the embodiment, viewed in the direction of the arrows III-III in FIG. 2.
Figure 4:
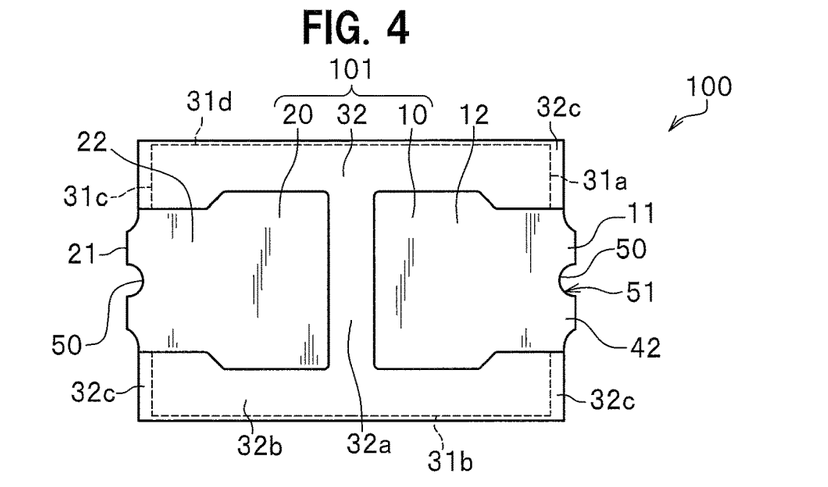
FIG. 4 is a schematic bottom view of the package according to the embodiment.

Description will be given of the structure of a light emitting device according to an embodiment of the present disclosure with reference to drawings. FIG. 1 is a schematic perspective view showing the whole of a light emitting device according to an embodiment of the present disclosure. FIG. 2 is a schematic plan view of a package according to the embodiment. FIG. 3 is a schematic cross-sectional view of the package according to the embodiment, viewed in the direction of the arrows III-III in FIG. 2. FIG. 4 is a schematic bottom view of the package according to the embodiment.

A light emitting device 1 has a package 100 containing a first resin body 30, a light emitting element 200, wires 250, and a sealing member 300 made of a second resin.

Package 100

The package 100 has a first resin body 30, a first electrode 10, and a second electrode 20. The package 100 is formed having a bottom portion 101 and a wall portion 31 surrounding a mounting region 110a on the bottom portion 101.

In the package 100, the bottom portion 101 and the wall portion 31 constitute a recess portion 110 which has an upper open end. The bottom surface of the recess portion 110 corresponds to the mounting region 110a, on which a semiconductor element is mounted. The recess portion 110 has an increasing opening area toward the upper open end.

The bottom portion 101 of the package 100 is composed of the first electrode 10, the second electrode 20, and a part of the first resin body 30.

The first resin body 30 has a wall portion 31 that constitutes side walls of the recess portion 110 and a retainer portion 32 to which the first electrode 10 and the second electrode 20 are fixed.

The retainer portion 32 is located in the bottom portion 101 of the package 100.

The retainer portion 32 has a middle portion 32a and peripheral portion 32b which surrounds the middle portion 32a, the first electrode 10, and the second electrode 20.

The peripheral portion 32b has a flange portion 32c that extends outwardly from the wall portion 31 in plan view.

In plan view, the first electrode 10 extends outwardly from an outer side 31a of the wall portion 31 beyond a distal end of the flange portion 32c. Likewise, in plan view, the second electrode 20 extends outwardly from an outer side 31c of the wall portion 31 beyond the distal end of the flange portion 32c.

Details of Package 100

The first electrode 10 has a first outer lead portion 11 and a first inner lead portion 12. The first outer lead portion 11 refers to a lead portion located outside of the outer side 31a of the wall portion 31. The first inner lead portion 12 refers to a lead portion located at the bottom of the recess portion 110 and a lead portion located under the wall portion 31.

The second electrode 20 has a second outer lead portion 21 and a second inner lead portion 22. The second outer lead portion 21 refers to a lead portion located outside of the outer side 31c of the wall portion 31. The second inner lead portion 22 refers to a lead portion located at the bottom of the recess portion 110 and a lead portion located under the wall portion 31.

The first inner lead portion 12 and the second inner lead portion 22 each have an approximately rectangular shape in plan view, but are not limited thereto. They may be provided with notches, recesses, and/or through-holes.

The first electrode 10 and the second electrode 20 are formed such that they are exposed on the lower surface of the package 100. The lower surface of the package 100 is to be mounted on an external board. On the lower surface of the package 100, the first electrode 10 and the second electrode 20 are not disposed on outer sides 31b and 31d of the wall portion 31. With this structure, when for example the package 100 is solder-bonded to an external board, leakage of solder to the outer sides 31b and 31d is decreased.

The first electrode 10 and the second electrode 20 are spaced apart from each other, so that the middle portion 32a is interposed therebetween. When the package 100 is used for a light emitting device, the first electrode 10 and the second electrode 20 respectively correspond to an anode electrode and a cathode electrode and thus have different electrical conduction.

The first outer lead portion 11 and the second outer lead portion 21 each have a distal end at which a notch 50 is formed. The notch 50 is a cut made in a depth direction as viewed from a side of the package 100. When the package 100 is for example solder-bonded to an external mounting board, the notch 50 permits the forming of a solder fillet therein.

The package 100 may be configured such that only either one of the first electrode 10 and the second electrode 20 has the notch 50 or such that only either one of the first electrode 10 and the second electrode 20 has the outer lead portion.

Preferably, the first electrode 10 and the second electrode 20 are made of a material such as a copper or a copper alloy and have a topmost surface plated with silver, aluminum, copper, or gold, for example.

For example, the first outer lead portion 11 has a plated layer on the surfaces thereof except end surfaces 43 and 44, which are located farthest from an outer side of the wall portion 31. As described later, the end surfaces 43 and 44 have no plated layer because these surfaces are cut surfaces which have appeared as a result of singulating the package 100 after plating. In contrast, a side surface 51 of the notch 50 and side surfaces 45 and 46 of the first outer lead portion 11 each have a plated layer because these surfaces have been formed by cutting before plating. Plated surfaces of the first outer lead portion 11 include an upper surface 41 and a lower surface 42, in addition to the side surfaces 45 and 46 and the side surface 51 of the notch 50. The second outer lead portion 21 has the same surface configuration as to whether individual surfaces have been plated.

The first inner lead portion 12 and the second inner lead portion 22 are plated. This increases the strength of bonding between the package 100 and an electrically conductive member such as solder. In addition, when a light emitting device is constructed by mounting a light emitting element in the recess portion 110 of the package 100, the plating applied to the first inner lead portion 12 and the second inner lead portion 22 increases the reflectance of light emitted from the light emitting element and reflected by the first inner lead portion 12 and the second inner lead portion 22.

The wall portion 31 of the first resin body 30 has an outer edge of a rectangular shape in plan view. The flange portion 32c is provided extending outwardly from the outer side 31a of the wall portion 31, in contact with the first outer lead portion 11. The first outer lead portion 11 is formed such that both the upper surface 41 and the lower surface 42 of the first outer lead portion 11 are flush with the flange portion 32c. The first outer lead portion 11 has lateral sides respectively adjacent to the flange portion 32c and extends beyond the distal end of the flange portion 32c in plan view.

The flange portion 32c has a thickness T, which is the same as that of the first outer lead portion 11. The flange portion 32c is not provided in the notch 50 of the first outer lead portion 11.

The flange portion 32c is provided extending outwardly from the outer side 31c of the wall portion 31, in contact with the second outer lead portion 21 in the same manner as with the first outer lead portion 11.

In plan view, a length W1 from the outer side 31c of the wall portion 31 to a distal end of the flange portion 32c is preferably at least 5 µm, and is particularly preferably about 20 µm for example to form the notch 50. The length from the outer side 31a of the wall portion 31 to a distal end of the flange portion 32c in plan view may be the same as or different from the length W1.

For each of the outer sides of the wall portion 31, the length from the outer side of the wall portion 31 to the distal end of the flange portion 32c is constant along the outer side in plan view. For example, paying attention to the outer side 31a, the length from the outer side 31a to the distal end of the flange portion 32c is constant along the outer side 31a except for a portion in which the first outer lead portion 11 is provided. Note that the flange portion 32c is not a burr. Similarly, paying attention to the outer side 31c, the length from the outer side 31c to the distal end of the flange portion 32c is constant along the outer side 31c except for a portion in which the second outer lead portion 21 is provided.

In plan view, the outer edge of the wall portion 31 is in a rectangular shape. The flange portion 32c may extend along at least one outer side of the wall portion 31 other than the outer sides 31a and 31c, at which the first electrode 10 and the second electrode 20 are respectively located. In this embodiment, the flange portion 32c also extends along the outer sides 31b and 31d of the wall portion 31.

In plan view, a length W2 from the outer side 31d of the wall portion 31 to a distal end of the flange portion 32c is preferably at least 5 µm, and, to prevent the outer side 31d from being damaged, more preferably at least 10 µm, and particularly preferably at least 20 µm. The length from the outer side 31b of the wall portion 31 to a distal end of the flange portion 32c in plan view may be the same as or different from the length W2. The length W2 may be the same as or different from the length W1.

The first resin body 30 has a chamfer 120 on the wall portion 31. The chamfer 120 may be a part of a corner which has been partially cut off, a part of a corner which has been formed so as to have a cut-off shape, or a part of a corner which has been formed so as to have a surface curved inward. The chamfer 120 is used as a mark indicating the polarity of the first electrode 10, i.e., a cathode mark or an anode mark. The chamfer 120 can be of any shape and size. In this embodiment, the chamfer 120 is formed in a reverse triangle shape extending between the outer sides 31a and 31b of the wall portion 31.

The wall portion 31 and the flange portion 32c can be separately formed, or can be integrally formed of the same material. It is preferable to integrally form the wall portion 31 and the flange portion 32c, because their strength is increased.

Hereinafter, a resin which constitutes the first resin body 30 is referred to as a first resin.

Examples of the first resin include a thermoplastic resin and a thermosetting resin.

As the thermoplastic resin, a polyphthalamide resin, a liquid crystal polymer, a polybutylene terephthalate (PBT), and an unsaturated polyester or the like can be used. The thermoplastic resin is heated and then cooled to be solidified. As the thermosetting resin, an epoxy resin, a modified epoxy resin, a silicone resin, and a modified silicone resin or the like can be used. The thermosetting resin is heated to be cured.

The first resin body 30 may contain a light reflecting material to efficiently reflect light at an inner wall surface of the wall portion 31 constituted by the first resin body 30. Examples of the light reflecting material include: titanium oxide, zinc oxide, zirconium oxide, aluminum oxide, silicon oxide, glass filler, silica, magnesium oxide, antimony oxide, aluminum hydroxide, barium sulfate, magnesium carbonate, and barium carbonate, which are relatively stable against moisture, highly refractive, and highly thermally conductive, and thus preferable.

The light emitting element 200 is disposed on at least one of the first electrode 10 and the second electrode 20 of the package 100. In this embodiment, the light emitting element 200 is fixed on the second electrode 20 located in the mounting region 110a and is electrically connected through wires 250 to the first inner lead portion 12 and to the second inner lead portion 22. The emission color of the light emitting element 200 can be of any wavelength depending on the use. For example, as a light emitting element emitting blue light (light having a wavelength between 430 to 490 nm), a GaN-based nitride semiconductor or an InGaN-based nitride semiconductor represented by for example $In_XAl_YGa_{1-X-Y}N$ ($0 \leq X \leq 1$, $0 \leq Y \leq 1$, $X+Y \leq 1$) may be used. The light emitting element 200 may be of the face-up structure or the face-down structure. Incidentally, a protective element may be mounted on an inner lead portion on which no light emitting element is mounted.

The wires 250 are electrically-conductive wiring lines that electrically connect electronic components such as the light emitting element 200 or protective elements with the first electrode 10 or the second electrode 20. Examples of the material for the wires 250 include a metal such as Au (gold), Ag (silver), Cu (copper), Pt (platinum), Al (aluminum), and an alloy of those. In particular, Au is preferably used for the wires 250.

The sealing member 300 encapsulates the light emitting element 200 and the like mounted on the mounting region 110a of the package 100. The sealing member 300 protects the light emitting element 200 and the like from an external force, dust, moisture, and the like and provides good heat resistance, weather resistance, and light resistance to the light emitting element 200. A resin constituting the sealing member 300 is hereafter called a second resin. Examples of the material for the second resin include a thermosetting resin, such as a silicone resin, an epoxy resin, and a urea resin, which are transparent materials. In addition to those materials, the second resin may contain a filler such as a phosphor or a light-diffusing material to have a predetermined function.

By, for example, mixing a phosphor into the second resin, the color tone of the light emitting device 1 may be easily adjusted. Preferably, as the filler to be contained in the second resin, a substance with high light reflectivity such as $SiO_2$, $TiO_2$, $Al_2O_3$, $ZrO_2$, and MgO may be used. Organic or inorganic coloring pigment and/or coloring dye may be used for the purpose of cutting off light outside a desired range of wavelengths.

Method for Manufacturing Package 100

Figure 5:
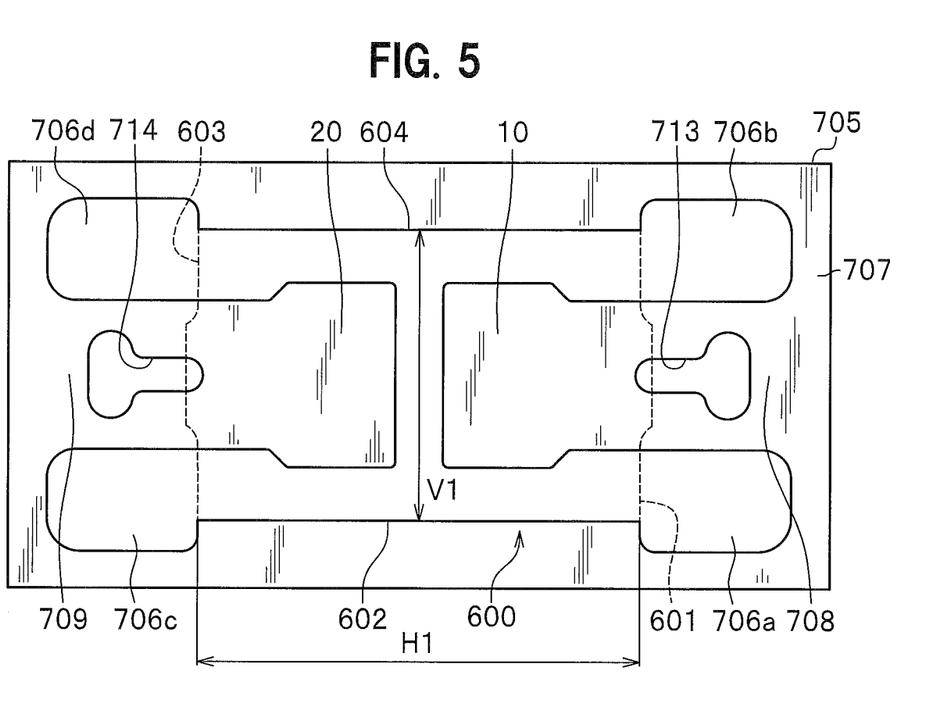
FIG. 5 is a plan view of a lead frame, representing an aspect of a process for manufacturing the package according to the embodiment.
Figure 6:
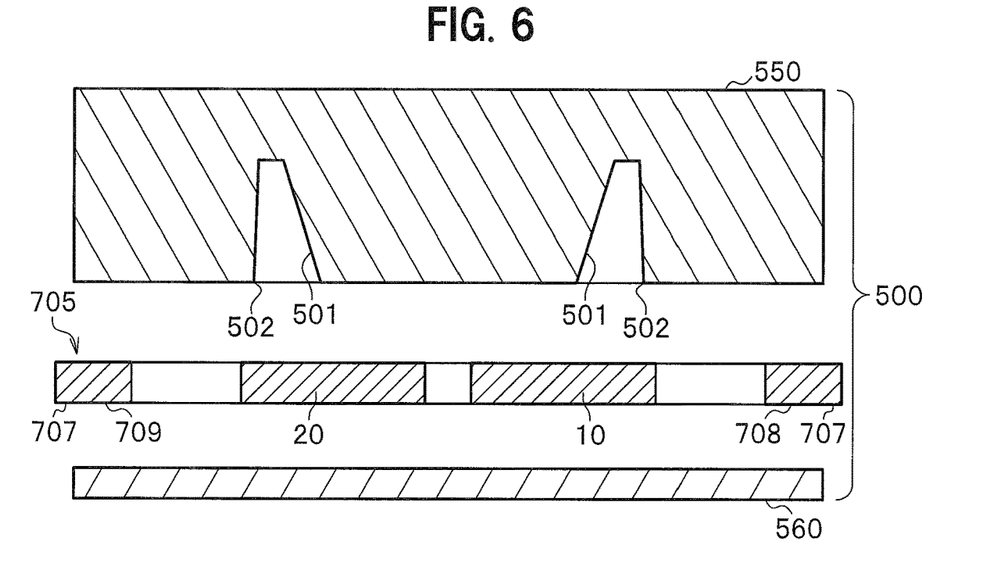
FIG. 6 is a cross-sectional view schematically showing the arrangement of the lead frame and a mold, taken along line IX-IX in FIG. 8, representing an aspect of the process for manufacturing the package according to the embodiment.
Figure 7:
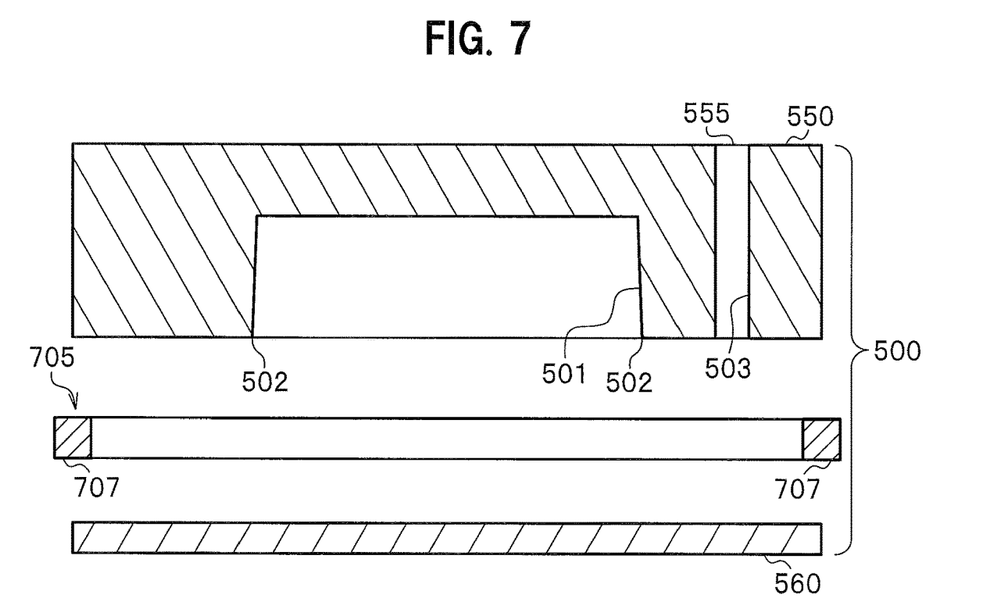
FIG. 7 is a cross-sectional view schematically showing the arrangement of the lead frame and the mold, taken along line X-X in FIG. 8, representing an aspect of the process for manufacturing the package according to the embodiment.
Figure 8:
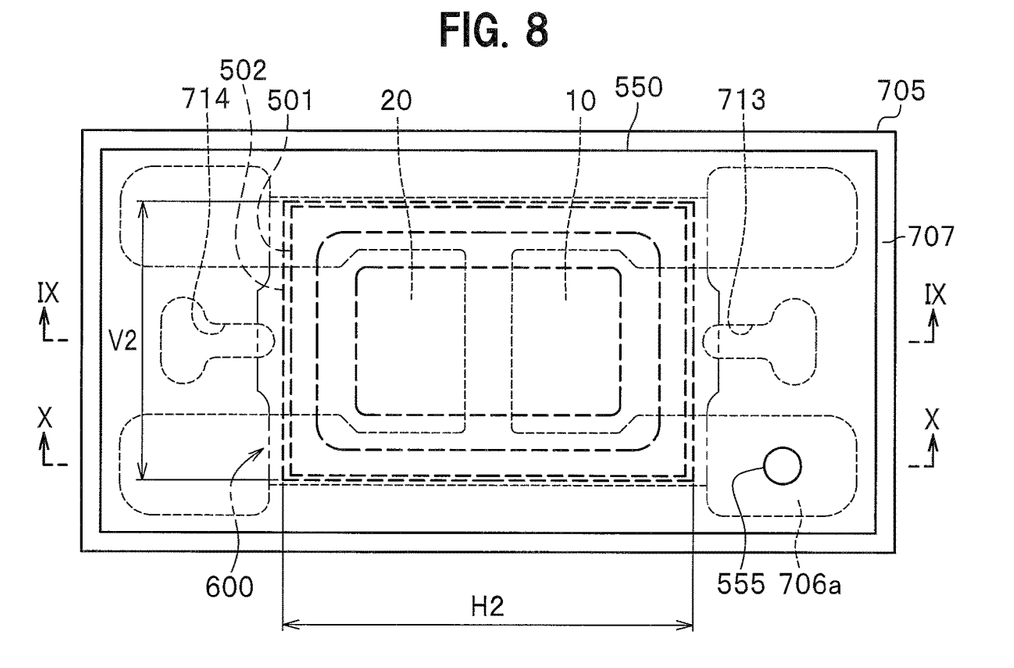
FIG. 8 is a plan view showing a lead frame sandwiched between an upper mold and a lower mold, representing an aspect of the process for manufacturing the package according to the embodiment.
Figure 9:
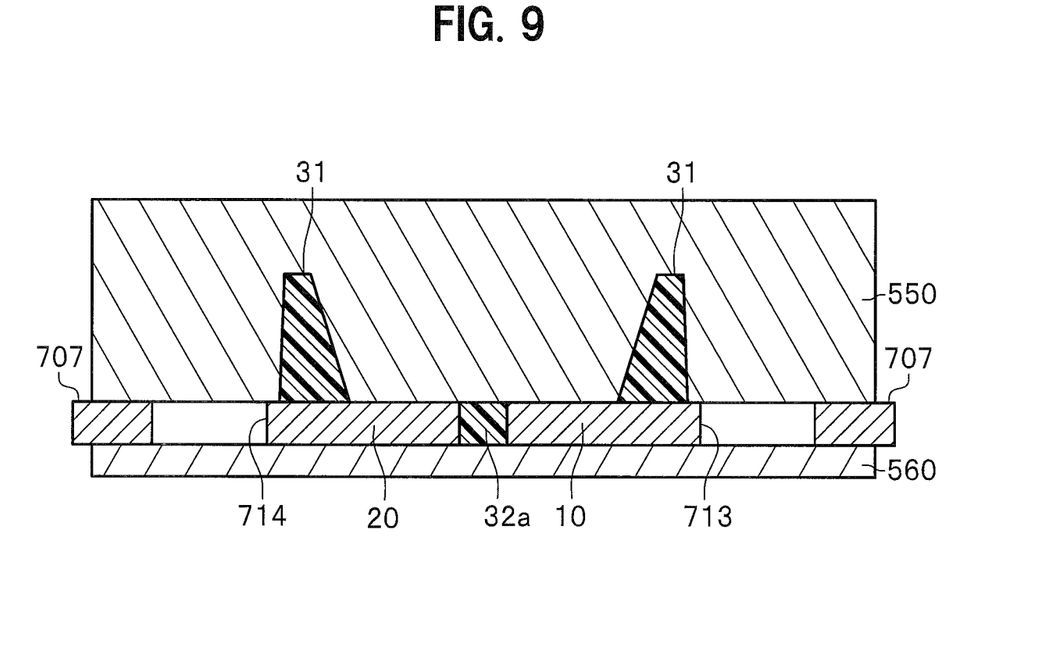
FIG. 9 is a schematic cross-sectional view of a package into which a first resin has been injected, viewed in the direction of the arrows IX-IX in FIG. 8, representing an aspect of the process for manufacturing the package according to the embodiment.
Figure 10:
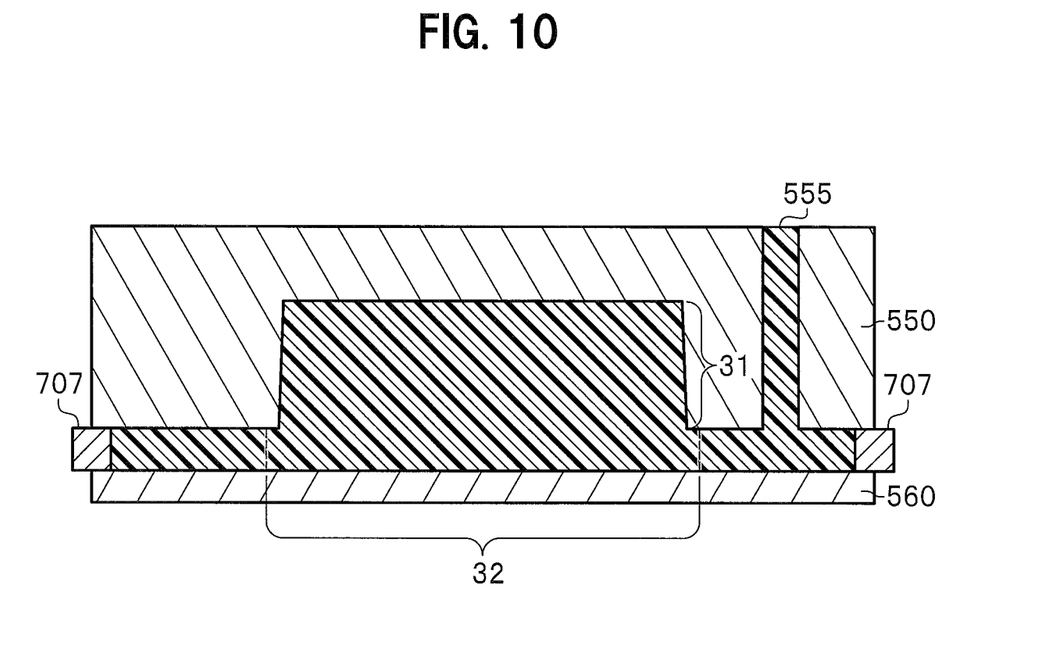
FIG. 10 is a schematic cross-sectional view of a package into which the first resin has been injected, viewed in the direction of the arrows X-X in FIG. 8, representing an aspect of the process for manufacturing the package according to the embodiment.
Figure 11:
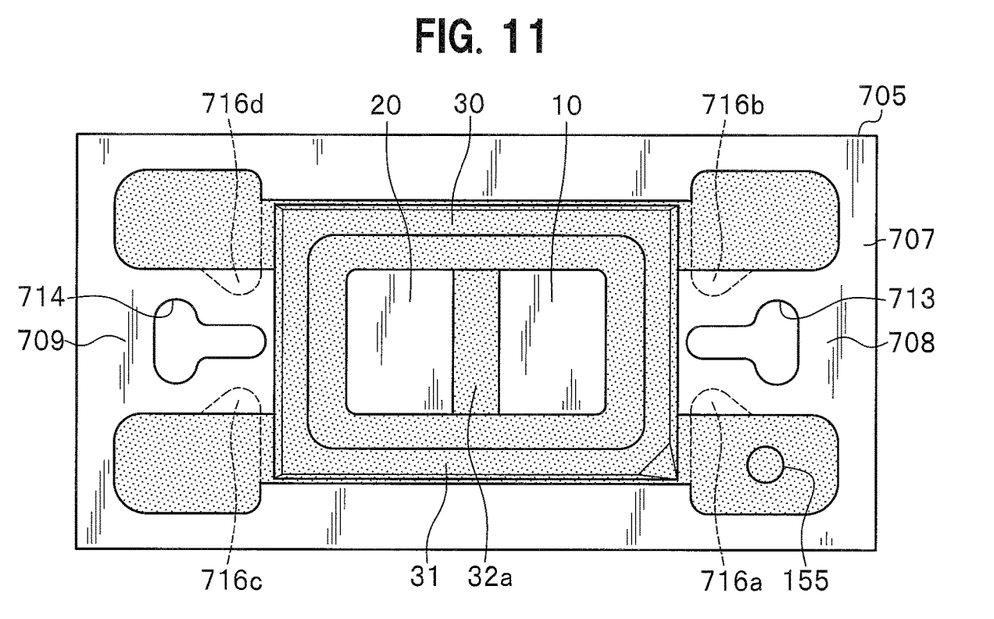
FIG. 11 is a schematic plan view of a molded resin from which an injection flow mark has not been removed yet, representing an aspect of the process for manufacturing the package according to the embodiment.
Figure 12:
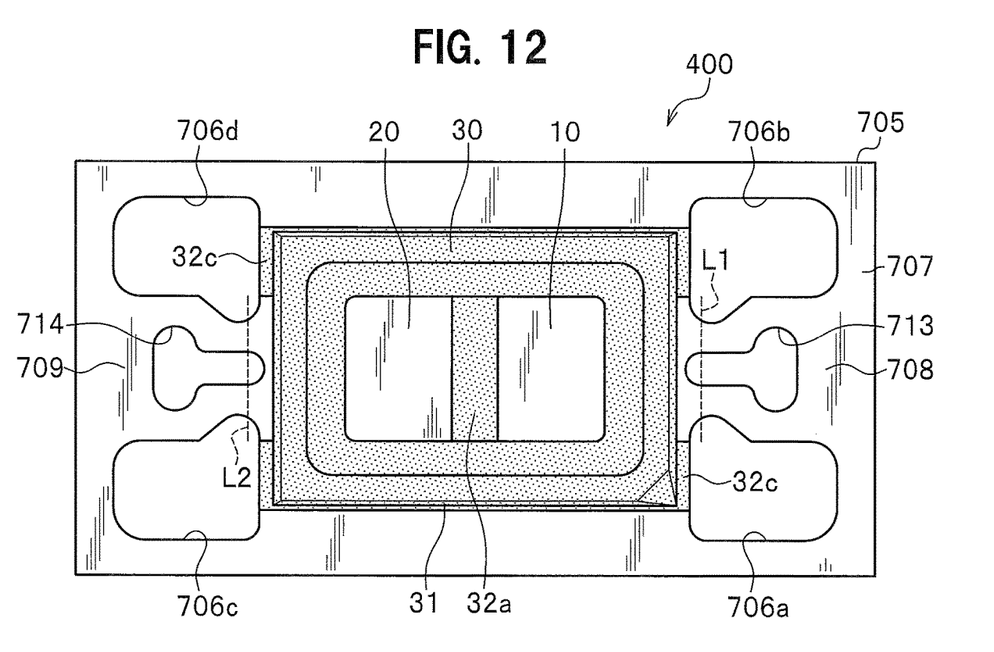
FIG. 12 is a schematic plan view of a molded resin from which an injection flow mark has been removed, representing an aspect of the process for manufacturing the package according to the embodiment.

Next, a description will be given of a method for manufacturing the package 100 with reference to FIGS. 5 to 12. FIG. 5 is a plan view of a lead frame, representing an aspect of a process for manufacturing the package according to the embodiment. FIG. 6 is a cross-sectional view schematically showing the arrangement of the lead frame and a mold, taken along line IX-IX in FIG. 8, representing an aspect of the process for manufacturing the package according to the embodiment. FIG. 7 is a cross-sectional view schematically showing the arrangement of the lead frame and the mold, taken along line X-X in FIG. 8, representing an aspect of the process for manufacturing the package according to the embodiment. FIG. 8 is a plan view showing a lead frame sandwiched between an upper mold and a lower mold, representing an aspect of the process for manufacturing the package according to the embodiment. FIG. 9 is a schematic cross-sectional view of a package into which a first resin has been injected, viewed in the direction of the arrows IX-IX in FIG. 8, representing an aspect of the process for manufacturing the package according to the embodiment. FIG. 10 is a schematic cross-sectional view of a package into which the first resin has been injected, viewed in the direction of the arrows X-X in FIG. 8, representing an aspect of the process for manufacturing the package according to the embodiment. FIG. 11 is a schematic plan view of a first resin body from which an injection flow mark has not been removed yet, representing an aspect of the process for manufacturing the package according to the embodiment. FIG. 12 is a schematic plan view of a first resin body from which an injection flow mark has been removed, representing an aspect of the process for manufacturing the package according to the embodiment.

The package manufacturing method includes a step for preparing a package intermediate body and a step for singulating a package from the package intermediate body. The process for preparing a package intermediate body includes the steps of: preparing a lead frame; injecting a first resin; curing or solidifying the injected resin; and removing an injection flow mark of the first resin.

A lead frame 705 may for example be constituted by a metal plate having a flat shape and made of good electrical conductor such as a copper or a copper alloy. The metal plate, however, may have steps or recesses and projections. The lead frame 705 is produced by punching out or etching a metal plate having a flat shape.

The lead frame 705 has a package formation region 600 where the first electrode 10 and the second electrode 20, whose polarity is different from that of the first electrode 10, are located. The package formation region 600 corresponds to the region enclosed by the perimeter of the bottom portion 101 of a package 100 which has been molded and separated from the lead frame 705. The first electrode 10 in the lead frame 705 corresponds to the first electrode 10 of the formed package.

Likewise, the second electrode 20 in the lead frame 705 corresponds to the second electrode 20 of the formed packaged. For simplicity, the lead frame 705 will be described to have one package formation region 600 for one package. However, a plurality of package formation regions 600 may be prepared in one lead frame 705.

The lead frame 705 is a plate-like member and has a through-opening section of a predetermined shape formed around the first electrode 10 and the second electrode 20 such that an end of the first electrode 10 and an end of the second electrode 20 are facing and spaced apart from each other. The lead frame 705 has a frame 707 that surrounds the first electrode 10 and the second electrode 20, a first connecting portion 708 connecting between the frame 707 and the first electrode 10, and a second connecting portion 709 connecting between the frame 707 and the second electrode 20.

The first connecting portion 708 and the second connecting portion 709 respectively connect the first electrode 10 and the second electrode 20 to the frame 707 so that the package intermediate body, from which an individual package has not been singulated, may not drop off while the package intermediate body is being transported. Here, singulation of a package means cutting parts of the lead frame 705 and releasing a package from the lead frame 705.

In the lead frame 705, the first electrode 10 has a portion corresponding to the first outer lead portion 11, which is formed when the package is formed and which is currently connected through the first connecting portion 708 to the frame 707. The through-opening section of the lead frame 705 includes a first through-opening 706a and a second through-opening 706b located adjacent to the first electrode 10. Here, it should be noted that the location adjacent to the first electrode means a location which is adjacent to the first connecting portion 708 and which is in the vicinity of the package formation region 600. In other words, in plan view of the lead frame 705, the first through-opening 706a and the second through-opening 706b are located diagonally adjacent to the first electrode 10, rather than directly adjacent to a side of the first electrode 10. Incidentally, in the present embodiment, the first resin is injected from the first through-opening 706a.

In the lead frame 705, the second electrode 20 has a portion corresponding to the second outer lead portion 21, which is formed when the package is formed and which is currently connected through the second connecting portion 709 to the frame 707. The through-opening section of the lead frame 705 includes a third through-opening 706c and a fourth through-opening 706d located adjacent to the second electrode 20. Here, it should be noted that the location adjacent to the first electrode means a location which is adjacent to the second connecting portion 709 and which is in the vicinity of the package formation region 600. In other words, in plan view of the lead frame 705, the third through-opening 706c and the fourth through-opening 706d are located diagonally adjacent to the second electrode 20, rather than directly adjacent to a side of the second electrode 20.

In the lead frame 705, the first through-opening 706a, the second through-opening 706b, the third through-opening 706c, and the fourth through-opening 706d are communicated with a portion of the through-opening section of the lead frame 705 which surrounds the first electrode 10 and the second electrode 20.

The lead frame 705 has a through-hole on at least one of the first electrode 10 and the second electrode 20 such that the through-hole partially belongs to an outer edge portion of the package formation region 600. Specifically, the lead frame 705 has a first through-hole 713 located between the first electrode 10 and the first connecting portion 708 and has a second through-hole 714 located between the second electrode 20 and the second connecting portion 709. The through-holes 713 and 714 are each independent and not communicated with the first through-opening 706a and the like. The through-holes 713 and 714 may be formed in a circular shape, an elliptical shape, a T shape, an I shape, or a cross shape.

The package formation region 600 is in an approximately rectangular shape in plan view and has a first edge 601, a second edge 602, a third edge 603, and a fourth edge 604.

The second edge 602 and the fourth edge 604 each extends in a straight line and coincides with an edge of the through-opening section of the lead frame 705.

A distance V1 between the second edge 602 and the fourth edge 604 is set to correspond to the width of the retainer portion 32 of a completed package.

A distance H1 between the first edge 601 and the third edge 603 is set to correspond to the length of the retainer portion 32 of a completed package.

The first edge 601 has a portion deviated toward the first connecting portion 708 such that the portion traverses the first through-hole 713; the third edge 603 has a portion deviated toward the second connecting portion 709 such that the portion traverses the second through-hole 714.

In the step of preparing a lead frame, the lead frame 705 is placed in a mold. Specifically, the first electrode 10 and the second electrode 20 of the lead frame 705 are sandwiched between an upper mold 550 and a lower mold 560, which are vertically separated parts of a mold 500. For convenience of explanation, some figures show a state in which the lower surface of the lead frame 705 and the lower mold 560 are spaced apart from each other. The lead frame 705 is fixed on the upper surface of the lower mold 560 in an actual process.

The upper mold 550 has a groove 501 which corresponds to the wall portion 31 of the first resin body 30 and into which the first resin is injected. In plan view, the groove 501 is formed in a continuous loop and has an outer edge 502 having a rectangular shape. The upper mold 550 has a flat portion joining the inner perimeter of the groove 501 and a flat portion joining the outer perimeter of the groove 501. The groove 501 has a portion corresponding to the chamfer 120.

The lead frame 705 is placed so that the package formation region 600 is positioned under the groove 501 of the upper mold 550 and the through-holes 713 and 714 are positioned outside of the groove 501. The upper mold 550 is provided with a through-space 503 that communicates with the first through-opening 706a outside the package formation region 600 when the upper mold 550 is aligned with the lead frame 705. In other words, in plan view, the mold 500 has the through-space 503 at a location outside of the groove 501.

The shape of the groove 501 corresponds to the shape of side walls of the recess portion 110 of a completed package. The groove 501 has inclined surfaces which are each formed to have an inclination matching the inclination of a corresponding outer side of the side walls of the recess portion 110.

In plan view, the maximum length H2 of the groove 501 (see FIG. 8) is set to correspond to the length of the wall portion 31 of a completed package and is slightly shorter than the distance H1 (see FIG. 5). The difference between H2 and H1 is twice the length W1 from the outer side 31a or 31c to a distal end of the flange portion 32c (see FIG. 2).

In plan view, the maximum width V2 of the groove 501 (see FIG. 8) is set to correspond to the width of the wall portion 31 of a complete package and is slightly shorter than the distance V1 (see FIG. 5). The difference between V2 and V1 is twice the length W2 from the outer side 31b or 31d to a distal end of the flange portion 32c (see FIG. 2).

As shown in FIGS. 5 and 8, in the present embodiment, adjustment is made to the location and size of the through-opening section of the lead frame 705 to make the size of the package formation region 600 slightly larger than the size of the groove 501 of the mold 500 in plan view, so that the flange portion 32c is formed entirely around the outer perimeter of the completed package.

After thus preparing the lead frame 705, the lead frame 705 and the upper mold 550 are aligned with each other as described. Then the flat portion joining the outer perimeter of the groove 501 of the upper mold 550 is brought into contact with the lead frame 705 at: at lease a part of the frame 707; the first connecting portion 708; the second connecting portion 709; a portion corresponding to the first outer lead portion 11 formed in the completed package; and a portion corresponding to the second outer lead portion 21 formed in the completed package. In this step, lead frame 705 is tightly sandwiched between the upper mold 550 and the lower mold 560 such that the first resin may not go into a gap between the lead frame 705 and the upper mold 550 and into a gap between the lead frame 705 and the lower mold 560. Subsequently, the first resin is injected from a gate 555, which is formed in the upper mold 550 as an inlet to the through-space 503, into the through-space 503.

For the first resin injection step, a known molding method such as injection molding or transfer molding may be used.

In this injection step, the first resin is injected from the gate 555, which is located adjacent to the first electrode 10 (first outer lead portion 11) in plan view, into the mold 500 in which the lead frame 705 is sandwiched between the upper mold 550 and the lower mold 560. In other words, in plan view, the gate 555 is located at the position where the first through-opening 706a of the lead frame 705 is provided. The gate 555, which is provided in the upper mold 550, is an inlet into the through-space 503 of the upper mold 550. When the lead frame 705 and the mold 500 are aligned with each other, the through-space 503 of the upper mold 550 is positioned so as to communicate with the first through-opening 706a of the lead frame 705. In this state, in plan view, the gate 555 of the upper mold 550 is positioned adjacent to the first electrode 10.

A light reflecting material such as titanium oxide has been blended into the first resin. The first resin is injected through the first through-opening 706a of the lead frame 705 into the groove 501 of the upper mold 550. The first resin is also injected into the second through-opening 706b, the third through-opening 706c, and the fourth through-opening 706d, which are communicated with the first through-opening 706a. In this step, the first resin does not enter the through-holes 713 and 714 of the lead frame 705.

In this step, the wall portion 31 of the first resin body 30 is formed with the first resin filled into the groove 501. In addition, the retainer portion 32 of the first resin body 30 is formed with the first resin filled into the through-opening section of the lead frame 705. When the retainer portion 32 is formed, a portion corresponding to the flange portion 32c, which will have been formed in the completed package, is formed adjacent to lateral sides of the first and second outer lead portions 11 and 21, which will have been formed in the completed package, with the same thicknesses of the first and second outer lead portions 11 and 21. At this time, the flange portion 32c is continuously connected to the gate 555.

When the first resin is a thermosetting resin, the first resin body 30 is formed by curing the first resin; when the first resin is a thermoplastic resin, the first resin body 30 is formed by solidifying the first resin.

After the first resin is cured or solidified, an injection flow mark of the first resin is removed from a portion of the first resin body which is located adjacent to the first electrode 10 or from a portion of the first resin body which is located adjacent to the first connecting portion 708. In this step, unnecessary portions of the first resin body which have been filled into the first through-opening 706a and other through-openings of the lead frame 705 are separated and removed by punching. As a result, as shown in FIG. 12, the package intermediate body 400 has no surface on which an injection flow mark remains.

In this step, only the unnecessary portion of the resin body may be removed. However, it is preferable that parts 716a to 716d of the lead frame 705 shown in FIG. 11 be removed together with the gate mark (injection flow mark) 155 because doing so reduces the area of the lead frame 705 which is to be cut in the next step. When the parts 716a to 716d of the lead frame 705 are removed, the shapes of these parts are predetermined such that the connection between the first electrode 10 and the first connecting portion 708 and the connection between the second electrode 20 and the second connecting portion 709 are maintained after the removal.

Preferably, plating is applied to portions of the lead frame 705 which are exposed in the package intermediate body 400. Specifically, for example, Ag is deposited on the lead frame 705 by electroplating. By this step, the first electrode 10 and the second electrode 20 are plated and inner wall surfaces of the through-holes 713 and 714 are also plated.

In the step for sigulating a package, parts of the lead frame 705 in the package intermediate body 400 are cut to produce a singulated package. In the step for singulating a package, only the lead frame 705 may be cut without cutting the resin body.

Specifically, the first connecting portion 708 is cut along the cutting line L1; the second connecting portion 709 is cut along the cutting line L2. The cutting line L1 corresponds to a projected portion of the first edge 601 of the package formation region 600; the cutting line L2 corresponds to a projected portion of the third edge 603 of the package formation region 600. The cutting line L1 traverses the first through-hole 713; the cutting line L2 traverses the second through-hole 714. In the step for singulating a package, the lead frame 705 is cut along lines respectively crossing the through-holes 713 and 714 by means of a lead cutter, for example.

Cutting the through-holes 713 and 714 of the lead frame 705 results in notches 50 respectively formed in the first and second outer lead portions 11 and 21. This step produces a completed package 100.

Light Emitting Device Manufacturing Method

The light emitting device manufacturing method is comprised of mounting a light emitting element 200 in the package 100, for example, prior to the above-described step for singulating the package 100 in the steps for manufacturing the package 100. This means that the light emitting element 200 is mounted on the second electrode 20 of the package 100 which has not been separated from the lead frame 705.

The light emitting element 200 is of a single-sided electrode structure having an upper surface on which a pair of an n-electrode and a p-electrode is formed. In this case, a die bonding resin is applied to the mounting region 110a of the package 100, then the light emitting element 200 is mounted on the mounting region 110a, and next a heating process is carried out with an oven to cure the die bonding resin. Subsequently, using a wire-bonding apparatus, one of the pair of electrodes of the light emitting element 200 is connected through a wire 250 to the first electrode 10 and the other one of the pair of electrodes of the light emitting element 200 is connected through a wire 250 to the second electrode 20.

Subsequently, for example by using a resin application apparatus, a second resin is applied into the recess portion 110 of the package 100 to seal the light emitting element 200. The second resin may contain, in addition to a thermosetting resin, at least one of a phosphor, an inorganic filler, and an organic filler. Subsequent to the application of the second resin, a heating process is carried out with an oven to cure the second resin. This establishes a sealing member 300. The foregoing steps produce a light emitting device 1. Note that, the step for mounting the light emitting element may be carried out after the step for singulating the package. That is, the light emitting device may be produced by mounting the light emitting element 200 in a singulated package.

As described above, the package intermediate body 400, from which an individual package has not been singulated yet, is connected to the frame 707 through the first connecting portion 708 and the second connecting portion 709. Thus, the package intermediate body 400 is transported without dropping off from the lead frame 705. The lead frame 705 has the first connecting portion 708 and the second connecting portion 709, and thus needs not to have a retainer portion underpinning a resin portion of the package from lateral sides thereof. If the lead frame is provided with such a retainer portion, package may have indentations formed by the retainer portion. If the package has indentations made by the retainer portion on a bottom portion of the package, resin burrs are likely to occur on the bottom portion of the package, resulting in a bad appearance. In addition, the burrs present an obstacle when such a package is solder-mounted on an external board. In contrast, the retainer portion 32 in the bottom portion 101 of the package 100 is formed without an indentation, and thus resin burrs are not likely to occur on the bottom portion 101, resulting in a good appearance and ease of mounting.

The lead frame 705 of the package intermediate body 400 is plated. In the step for singulating a package, the notches 50 are formed in the package intermediate body 400 by cutting the lead frame 705 along lines respectively crossing the through-holes 713 and 714. The end surfaces 43 and 44, which have appeared as a result of the cutting of the lead frame 705, have not been plated and thus make no contribution to bonding, because electrically conductive members such as solder do not adhere to the end surfaces 43 and 44. In contrast, plating has been applied to the side surfaces 45 and 46 of the first outer lead portion 11 and the second outer lead portion 21, and the side surfaces 51 of the notches 50. Thus, electrically conductive members such as solder adhere to these surfaces, and therefore these surfaces contribute to the bonding. Therefore, the package 100 enjoys a greater bonding strength of an electrically conductive member such as solder as compared with a case in which there is no notch 50.

In the package 100, plating has been applied to the side surfaces 45 and 46 of the first outer lead portion 11 and the second outer lead portion 21, and to the side surfaces 51 of the notches 50. Thus, when the package 100 is for example solder-mounted on an external mounting board, solder fillets can be formed along the side surfaces 45 and 46 and in the notches 50. In the package 100, plating has been applied to the upper surfaces 41 and lower surfaces 42 of the first outer lead portion 11 and the second outer lead portion 21. Thus, an electrically conductive member such as solder may join the upper surfaces to the lower surfaces through the side surfaces 45 and 46 and through the side surfaces 51 of the notches 50, to form a castellated electrode.

Conventionally, a resin is injected from a lower side of a package. In contrast, in the package manufacturing method according to the present embodiment, the first resin is injected from an inlet located outside of the package formation region 600, in the vicinity of the first electrode 10. The first resin thus injected and then cured or solidified in the vicinity of the first electrode 10 becomes unnecessary and removed together with the gate mark 155. This allows the package 100 and the light emitting device 1 to be made thinner than conventional packages. In particular, the bottom portion 101 of the package 100 is allowed to have a smaller thickness than those of conventional packages. This enables improvement in heat dissipation of an operating light emitting element mounted on the package 100. Removal of the unnecessary resin and the gate mark 155 results in the flange portion 32*c* remaining adjacent to the first electrode 10.

In the present embodiment, the flange portion 32*c* of the package 100 extends from the outer sides 31*b* and 31*d* of the wall portion 31. This prevents package surfaces from being damaged when the package is removed from the lead frame 705. That is, before the package is singulated, parts of the flange portion 32*c* located below the outer sides 31*b* and 31*d* of the wall portion 31 are in contact with the lead frame 705. When the first connecting portion 708 and the second connecting portion 709*a* are cut, the package is removed without the outer sides 31*b* and 31*d* of the wall portion 31, which are located above the flange portion 32*c*, making contact with the lead frame 705.

The package and light emitting device according to the present disclosure have been specifically described hereinabove. However, the spirit of the present disclosure is not limited thereto and should be construed broadly based on the scope of claims. It goes without saying that the spirit of the present invention includes also variations and modifications based on the description.

For example, the upper mold 550 of the mold 500 shown in FIG. 8 has only one gate 555 formed thereon. However, two gates may be respectively formed at two portions located adjacent to the first electrode 10 when the lead frame 705 is placed in the mold 500, to inject the first resin from the two gates. Alternatively, in addition to gates located adjacent to the first electrode 10 when the lead frame 705 is placed in the mold 500, one or two other gates may be formed at two portions located adjacent to the second electrode 20 to inject the first resin therefrom. Alternatively, a gate may be formed on the lower mold 560 instead of the upper mold 550 to inject the first resin from the lower mold 560.

EXAMPLES

An example will be described below with reference to the package according to the embodiment. However, the invention is not limited to this example. The size of the example described below may have an error of ±10%.

The package 100 according to the example measured about 2.2 mm in longer side, about 1.4 mm in shorter side, and about 0.7 mm in height. These dimensions included those of the first electrode 10 and the second electrode 20. The lengthwise distance between the opposite outer sides 31*a* and 31*c* of the wall portion 31 was about 2.0 mm; the outer lead portion 11 of the first electrode 10 and the outer lead portion 21 of the second electrode 20 each were about 0.1 mm in length as measured from the wall portion 31 in the lengthwise direction. The width W1 of parts of the flange portion 32*c* located adjacent to the first electrode 10 and the second electrode 20 was about 0.05 mm. The distal end of the first outer lead portion 11 of the first electrode 10 and the distal end of the second outer lead portion 21 of the second electrode 20 are each extended beyond the distal end of the flange portion 32*c* by about 0.05 mm. The notches 50 each had a depth of about 0.05 mm from the distal end of the corresponding outer lead portion. The first electrode 10 and the second electrode 20 each had a thickness of about 0.2 mm. The inner sides of the wall portion 31 were formed in an approximately rounded rectangular shape in plan view, which measured about 1.65 mm in longer side and about 1.1 mm in shorter side.

The first electrode 10 and the second electrode 20 were formed of a copper-based material. Silver plating was applied to the surfaces of the first electrode 10 and the second electrode 20 that were exposed from the first resin body 30. The first resin body 30 was made of a polyamide resin containing titanium oxide as a light reflecting material. The sealing member 300 was formed of a silicone resin. As the light emitting element 200, one formed by stacking nitride semiconductor layers on a sapphire substrate was used. As the wires 250 electrically connecting between the light emitting element 200 and the first electrode 10 and between the light emitting element 200 and the second electrode 20, wires containing gold as a major component were used.

The light emitting devices of the embodiments according to the present disclosure are applicable to lighting devices and automotive light emitting devices.

What is claimed is:

1. A package intermediate body comprising:
a lead frame having a frame, a first electrode, a second electrode, a first connecting portion connecting the frame and the first electrode, a second connecting portion connecting the frame and the second electrode, a first through-hole between the first electrode and the first connecting portion, and a second through-hole between the second electrode and the second connecting portion; and
a first resin body having:
a retainer portion retaining the first electrode and the second electrode, the retainer portion forming a bottom portion of the package intermediate body together with the first electrode and the second electrode, the bottom portion having a mounting region on which an electronic component is to be mounted; and
a wall portion surrounding the mounting region and having a plurality of outer sides,
wherein the retainer portion has a flange portion extending outwardly from and along the plurality of outer sides of the wall portion in plan view, and
wherein the first connecting portion and the second connecting portion are each located outside a distal end the flange portion in plan view.

2. A package comprising:
a first electrode;
a second electrode;
a first resin body having:
a retainer portion retaining the first electrode and the second electrode, the retainer portion forming a bottom portion of the package together with the first electrode and the second electrode, the bottom portion having a mounting region on which an electronic component is to be mounted; and
a wall portion surrounding the mounting region and having a plurality of outer sides,
wherein two of the plurality of outer sides of the wall portion constitute a pair of opposite outer sides,
wherein the first electrode has a first outer lead portion extending from one of the pair of opposite outer sides and the second electrode has a second outer lead portion extending from the other one of the pair of opposite outer sides,
wherein the first resin body further has a flange portion, the flange portion having a part extending outwardly from the outer side from which the first outer lead portion extends in plan view, the flange portion having a part extending outwardly from the outer side from which the second outer lead portion extends in plan view, and
wherein each of the first outer lead portion and the second outer lead portion extends outwardly beyond a distal end of the corresponding part of the flange portion in plan view.

3. A package according to claim 2,
wherein an outer edge of the wall portion is in a rectangular shape in plan view, and
wherein the flange portion further has a part extending from at least one of the outer sides of the wall portion other than the pair of opposite outer sides thereof at which the first electrode and the second electrode are located.

4. A package according to claim 2,
wherein an outer edge of the wall portion is in a rectangular shape in plan view, and
wherein the flange portion further has two parts respectively extending from the other two outer sides of the wall portion other than the pair of opposite outer sides thereof at which the first electrode and the second electrode are located.

5. A package according to claim 2,
wherein each part of the flange portion has a distal end whose distance from the corresponding outer side of the wall portion is constant therealong in plan view.

6. A package according to claim 2,
wherein the part of the flange portion corresponding to the first electrode and the part of the flange portion corresponding to the second electrode are respectively disposed in contact with the first electrode and the second electrode.

7. A package according to claim 2,
wherein the part of the flange portion corresponding to the first electrode has a same thickness as a thickness of the first electrode and the part of the flange portion corresponding to the second electrode has a same thickness as a thickness of the second electrode.

8. A package according to claim 2,
wherein each of the parts of the flange portion has a distal end whose distance from the corresponding outer side of the wall portion is at least 5 µm in plan view.

9. A package according to claim 2,
wherein each of the outer lead portions has a distal end at which a notch is formed in plan view.

10. A package according to claim 9,
wherein the flange portion is not formed in the notch.

11. A package according to claim 2,
wherein each of the first outer lead portion and the second outer lead portion has a plated layer except an end surface located farthest from the corresponding one of the pair of outer sides of the wall portion.

12. A package according to claim 2,
wherein each of the first outer lead portion and the second outer lead portion has opposite sides adjacent to which the corresponding part of the flange portion is located in plan view.

13. A package according to claim 2,
wherein the wall portion and the flange portion are integrally made of a same material.

14. A light emitting device comprising:
a package according to claim 2; and
a light emitting element mounted on at least one of the first electrode and the second electrode of the package.

15. A light emitting device according to claim 14,
wherein the light emitting element is sealed with a second resin.

* * * * *